United States Patent
Tang et al.

(10) Patent No.: US 11,417,491 B2
(45) Date of Patent: Aug. 16, 2022

(54) EMITTER, ELECTRON GUN IN WHICH SAME IS USED, ELECTRONIC DEVICE IN WHICH SAME IS USED, AND METHOD FOR MANUFACTURING SAME

(71) Applicant: NATIONAL INSTITUTE FOR MATERIALS SCIENCE, Tsukuba (JP)

(72) Inventors: Jie Tang, Tsukuba (JP); Jinshi Yuan, Tsukuba (JP); Luchang Qin, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 162 days.

(21) Appl. No.: 16/767,689

(22) PCT Filed: Nov. 9, 2018

(86) PCT No.: PCT/JP2018/041601
§ 371 (c)(1),
(2) Date: May 28, 2020

(87) PCT Pub. No.: WO2019/107113
PCT Pub. Date: Jun. 6, 2019

(65) Prior Publication Data
US 2020/0388458 A1  Dec. 10, 2020

(30) Foreign Application Priority Data

Nov. 29, 2017 (JP) .............................. JP2017-228505

(51) Int. Cl.
*H01J 9/02* (2006.01)
*H01J 1/304* (2006.01)
(Continued)

(52) U.S. Cl.
CPC ............ *H01J 1/304* (2013.01); *C01B 32/914* (2017.08); *H01J 9/025* (2013.01); *B82Y 30/00* (2013.01);
(Continued)

(58) Field of Classification Search
CPC ....................................................... H01J 9/025
See application file for complete search history.

(56) References Cited

U.S. PATENT DOCUMENTS 7,828,622 B1  11/2010  Brodie et al.
9,490,098 B1  11/2016  Mackie et al.
(Continued)

FOREIGN PATENT DOCUMENTS

JP   2015-518245 A    6/2015
WO   2016/140177 A1   9/2016

OTHER PUBLICATIONS

Yuan et al., "Field emission from singlecrystalline HfC nanowires", Applied Physics Letters, 2012, 100: 113111, pp. 1-3, [retrieved on Jan. 23, 2019] URL:https://doi.org/10.1063/10.63/1.3694047.
(Continued)

*Primary Examiner* — Vip Patel
(74) *Attorney, Agent, or Firm* — Morgan, Lewis & Bockius LLP (57) ABSTRACT

The purpose of the present invention is to provide an emitter that is made of hafnium carbide (HfC) and that releases electrons in a stable and highly efficient manner, a method for manufacturing the emitter, and an electron gun and electronic device in which the emitter is used. In this nanowire equipped emitter, the nanowires are made of hafnium carbide (HfC) single crystal, the longitudinal direction of the nanowires match the <100> crystal direction of the hafnium carbide single crystal, and the end part of the nanowires through which electrons are to be released com-
(Continued)

prise the (200) face and the {310} face of the hafnium carbide single crystal, with the (200) face being the center and the {311} faces surrounding the (200) face.

18 Claims, 8 Drawing Sheets

(51) Int. Cl.
    *C01B 32/914*     (2017.01)
    *B82Y 30/00*     (2011.01)
    *B82Y 40/00*     (2011.01)

(52) U.S. Cl.
    CPC ........... *B82Y 40/00* (2013.01); *C01P 2004/16* (2013.01); *C01P 2004/80* (2013.01); *H01J 2201/30484* (2013.01); *H01J 2209/0223* (2013.01)

(56) References Cited

U.S. PATENT DOCUMENTS

| | | |
|---|---|---|
| 2015/0054398 A1 | 2/2015 | Yan |
| 2018/0019091 A1 | 1/2018 | Tang et al. |

OTHER PUBLICATIONS

International Search Report (with partial translation) and Written Opinion issued in corresponding International Patent Application No. PCT/JP2018/041601 dated Feb. 5, 2019.
International Preliminary Report on Patentability issued in corresponding International Patent Application No. PCT/JP2018/041601 dated Jun. 11, 2020.

START

↓

S210 | NANOWIRE MADE OF HAFNIUM CARBIDE SINGLE CRYSTAL IS HEATED IN VACUO. LONGITUDINAL DIRECTION OF NANOWIRE CORRESPONDS TO <100> CRYSTAL DIRECTION OF HAFNIUM CARBIDE SINGLE CRYSTAL. HEATING IS PERFORMED UNDER VACUUM OF $1 \times 10^{-10}$ Pa OR MORE AND $1 \times 10^{-6}$ Pa OR LESS IN TEMPERATURE RANGE OF 300°C OR MORE AND 1000°C OR LESS FOR 5 SECONDS OR MORE AND 30 MINUTES OR LESS.

EMITTER, ELECTRON GUN IN WHICH SAME IS USED, ELECTRONIC DEVICE IN WHICH SAME IS USED, AND METHOD FOR MANUFACTURING SAME

TECHNICAL FIELD

The present invention relates to an emitter, an electron gun using the same, an electronic device using the same, and a method for manufacturing the same.

BACKGROUND ART

Various improvements have been made to electron guns used in electron microscopes in order to produce observation images having high-resolution and high-brightness. Examples of an electron source using such an electron gun include a field emission-type electron source, a Schottky-type electron source, and the like. These are characterized in that the tip of an emitter used in an electron gun is sharpened to generate an electric field concentrating effect at the tip and to emit more electrons through the tip.

In recent years, an emitter composed of a hafnium carbide single crystal nanowire coated with hafnium oxide has been developed (for example, see Patent Literature 1). However, further stability of the electron emission property from the hafnium carbide nanowire emitter in Patent Literature 1 is required. Specifically, further stability of electron emission (also referred to as "field electron emission" or "field emission") property from a nanowire emitter made of hafnium carbide single crystal before being coated with hafnium oxide in Patent Literature 1 is required.

CITATION LIST

Patent Literature

PATENT LITERATURE 1: WO 2016/140177 A

SUMMARY OF INVENTION

Technical Problem

An object of the present invention is to provide an emitter made of hafnium carbide (HfC) single crystal wherein the emitter emits electrons in a stable and high efficiency, a method for manufacturing the emitter, and an electron gun and electronic device using the emitter.

Solution to Problem

The inventors of the present application have conducted intensive studies to achieve the above object. As a result, the present inventors have firstly found an emitter including a nanowire, the nanowire being made of hafnium carbide (Hit) single crystal, the longitudinal direction of the nanowire corresponding to the <100> crystal direction of the hafnium carbide single crystal, the end of the nanowire through which electrons are to be emitted having the (200) plane and the {311} plane(s) of the hafnium carbide single crystal, the (200) plane is centered, and the {311} plane(s) surrounding the (200) plane, and also have found that the emitter has a field emission area more concentrated on the center (tip) of the emitter end than a conventional emitter made of hafnium carbide single crystal (specifically, a nanowire emitter made of hafnium carbide single crystal before being coated with hafnium oxide in Patent Literature 1), so that more stable electron emission can be provided as compared to a conventional emitter made of hafnium carbide single crystal. In this way, the present invention has been completed.

The above problems are solved by the emitter equipped with a nanowire according to the present invention, in which the nanowire is made of hafnium carbide (HfC) single crystal, the longitudinal direction of the nanowire corresponds to the <100> crystal direction of the hafnium carbide single crystal, the end of the nanowire through which electrons are to be emitted has the (200) plane and the {311} plane(s) of the hafnium carbide single crystal, the (200) plane is centered, and the {311} plane(s) surrounds the (200) plane.

The length in the lateral direction of the nanowire is 1 nm or more and 100 nm or less, and the length in the longitudinal direction of the nanowire may be 500 nm or more and 30 μm or less.

The end through which electrons are to be emitted may have a tapered shape.

The end through which electrons are to be emitted may be terminated with hafnium (Hf) of the hafnium carbide single crystal.

The hafnium may be combined with oxygen and/or nitrogen.

The end through which electrons are to be emitted may be coated with an oxide, nitride or oxynitride of the hafnium.

The thickness of the hafnium oxide, nitride or oxynitride may be 1 nm or more and 5 nm or less.

An electron gun equipped with at least the emitter according to the present invention, in which the emitter is the above-mentioned emitter, thereby solving the above problems.

The emitter further includes a needle and a filament, in which the nanowire may be attached to the filament via the needle made of an element selected from the group consisting of tungsten (W), tantalum (Ta), platinum (Pt), rhenium (Re) and carbon (C).

The electron gun may be a cold cathode field emission electron gun or a Schottky electron gun.

An electronic device equipped with the electron gun according to the present invention has the above-mentioned electron gun as the electron gun, and the electronic device is selected from the group consisting of scanning electron microscope, transmission electron microscope, scanning transmission electron microscope, Auger electron spectrometer, electron energy loss spectrometer, and energy dispersive electron spectrometer, thereby solving the above problem.

A method for manufacturing the above emitter according to the present invention includes a heating step of heating a nanowire made of hafnium carbide single crystal in vacuo, in which the longitudinal direction of the nanowire corresponds to the <100> crystal direction of the hafnium carbide single crystal, the end of the nanowire is heated under a vacuum of $1\times10^{-10}$ Pa or more and $1\times10^{-6}$ Pa or less in a temperature range of 300° C. or more and 1000° C. or less for 5 seconds or more and 30 minutes or less, thereby solving the above problems.

In the heating step, the end of the nanowire may be heated in a temperature range of more than 600° C. and 1000° C. or less for 1 minute or more and 5 minutes or less.

In the heating step, the end of the nanowire may be heated in a temperature range of 650° C. or more and 750° C. or less for 1 minute or more and 5 minutes or less.

In the heating step, the nanowire may be attached to a filament, and the filament is energized and heated.

Subsequent to the heating step, a step of introducing oxygen and/or nitrogen may be further included.

In the step of introducing oxygen and/or nitrogen, oxygen and/or nitrogen may be introduced until the pressure becomes greater than $1 \times 10^{-6}$ Pa and $1 \times 10^{-4}$ Pa or less.

In the step of introducing oxygen and/or nitrogen, the end of the nanowire may be heated in a temperature range of 650° C. or more and 850° C. or less for 3 minutes or more and 10 minutes or less.

Advantageous Effects of Invention

An emitter equipped with a nanowire made of hafnium carbide (Hf) single crystal according to the present invention is configured so that the longitudinal direction of the nanowire corresponds to the <100> crystal direction of the hafnium carbide single crystal, the end of the nanowire through which electrons are to be emitted has the (200) plane and the {311} plane(s), the (200) plane is centered, and the {311} plane(s) surrounds the (200) plane. Accordingly, the field emission area can be more concentrated on the center (tip) of the emitter end than a conventional nanowire emitter made of hafnium carbide single crystal (specifically, a nanowire emitter made of hafnium carbide single crystal before being coated with hafnium oxide in Patent Literature 1). As a result, electrons can be stably emitted with high efficiency. Using such an emitter can provide an electron gun which is stable for a long time, and an electronic device using it.

Also, in the emitter equipped with a nanowire made of hafnium carbide (HfC) single crystal according to the present invention, in addition that modifying the surface so that the end has the above-mentioned plane orientation can stably emit electrons with high efficiency, combining the end terminated with Hf with oxygen and/or nitrogen so as to coat its end with hafnium oxide, nitride or oxynitride can stably emit electrons with higher efficiency. In this case, since the end to be coated is surface-modified so as to have the above-mentioned plane orientation, the coated end can stably emit electrons with higher efficiency, compared to the end of a conventional nanowire emitter made of hafnium carbide single crystal coated with hafnium oxide, nitride or oxynitride.

A method for manufacturing a nanowire made of HfC single crystal according to the present invention includes a heating step of heating a nanowire made of HfC single crystal in vacuo under a predetermined condition, in which the longitudinal direction of the nanowire corresponds to the <100> crystal direction of the HfC single crystal, and the end of the nanowire is heated under a vacuum of $1 \times 10^{-10}$ Pa or more and $1 \times 10^{-6}$ Pa or less in a temperature range of 300° C. or more and 1000° C. or less for 5 seconds or more and 30 minutes or less. When being heated in the above-mentioned condition, in addition to cleaning a nanowire by ordinary heat flashing, the surface can be modified so that the end of the nanowire has the (200) plane and the {311} plane(s), the (200) plane is centered, and the {311} plane(s) surrounds the (200) plane. The above-mentioned "ordinary heat flashing" performed for cleaning a nanowire is an optional treatment in the method for manufacturing a nanowire made of HfC single crystal according to the present invention, because the surface modification can be performed so that the above end has the above-mentioned plane orientation, regardless of the presence or absence of the ordinary heat flashing. However, this treatment is preferable in that the end of the nanowire surface-modified to have the plane orientation is efficiently obtained.

In this way, in the present invention, when the end of the nanowire made of HfC single crystal is heated under a predetermined condition in vacuo without performing an electrolytic evaporation treatment, an emitter can be obtained of which the above end is surface-modified so as to have the above-mentioned plane orientation. Therefore, in the present invention, the surface modification can be performed more easily than the case where the surface modification is performed by electrolytic evaporation treatment.

DESCRIPTION OF EMBODIMENTS

Hereinafter, embodiments of the present invention are described with reference to the drawings. It should be noted that identical components are denoted by identical or substantially identical reference numerals, and descriptions thereof are omitted. Crystal planes and directions are described herein using a well-known system of coordinates known as Miller Indices.

Embodiment 1

Embodiment 1 describes an emitter according to the present invention and a method for manufacturing the same.

Figure 1:
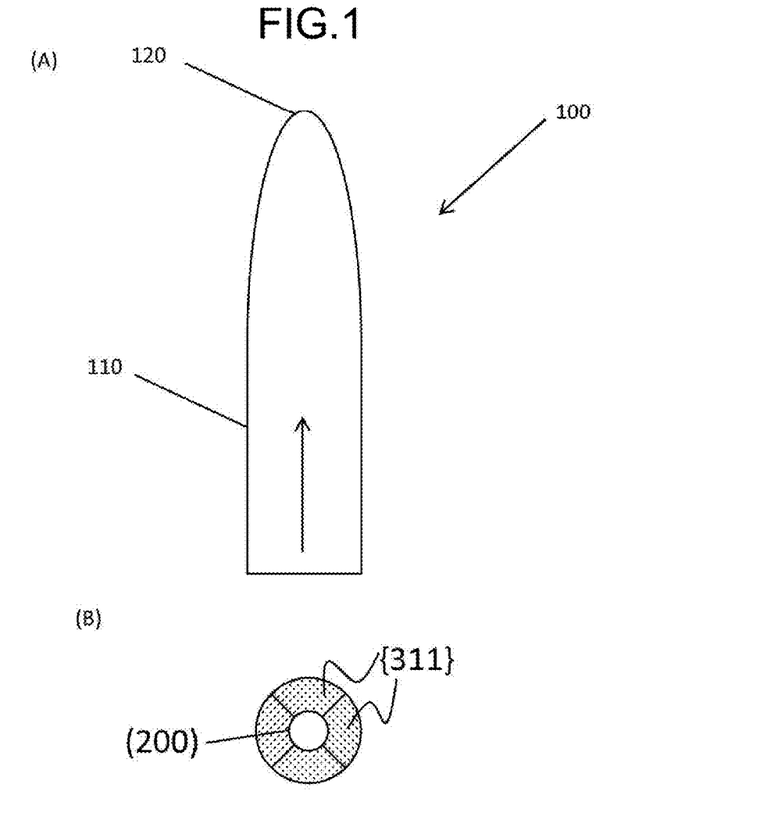
FIG. 1 is a schematic view of the emitter according to Embodiment 1.

FIG. 1 is a schematic view of the emitter according to Embodiment 1.

The emitter according to the present invention includes a nanowire 100 made of hafnium carbide (hereinafter, referred to as HfC) single crystal 110. Furthermore, the longitudinal direction of the nanowire 100 corresponds to the <100> crystal direction of the HfC single crystal. As shown in FIG. 1(B), the end 120 of the nanowire 100 through which electrons are to be emitted has the (200) plane and the {311} plane(s) of the HfC single crystal 100, the (200) plane is centered, and the {311} plane(s) surrounds the (200) plane.

In the present invention, since the nanowire 100 is made of HfC single crystal 110, the end 120 through which electrons are to be emitted is controlled at an atomic level. Accordingly, electrons can be stably emitted. Furthermore, since the end 120 through which electrons are to be emitted is surface-modified to have the above-mentioned plane orientation, electrons can be stably emitted with high efficiency.

A plane surrounding the (200) plane may have the {201} plane or the like in addition to the {311} plane(s). Also in this case, it is desirable that the plane is surface-modified so that the area of the {311} plane(s) is larger than that of the {201} plane.

Preferably, the length in the lateral direction (that is, the diameter) of the nanowire 100 is in a range of 1 nm or more and 100 nm or less, and the length in the longitudinal direction is in a range of 500 nm or more and 30 μm or less. With such a size, an electric field concentration can be effectively generated at the end 120 through which electrons are to be emitted, so that more electrons can be emitted through the end.

More preferably, the length in the lateral direction of the nanowire 100 is in a range of 10 nm or more and 60 nm or less, and the length in the longitudinal direction is in a range of 5 μm or more and 30 μm or less. For example, in case of manufacturing the nanowire 100 using a chemical vapor deposition method (CVD) mentioned below, the nanowire 100 can be easily provided having the above-mentioned range and made of high-quality HfC single crystal with no cracks, kinks or the like.

Preferably, the end 120 through which electrons are to be emitted has a tapered shape. Accordingly, the {311} plane(s) can be configured to surround the (200) plane which is centered, as mentioned above. Such a processing and treatment can be performed using a heat treatment mentioned below.

In the emitter equipped with the nanowire made of hafnium carbide (HfC) single crystal according to the present invention, the end 120 of the emitter is surface-modified so as to have the above-mentioned plane orientation, as mentioned above, so that more tapered shape can be obtained than the case of a conventional nanowire emitter made of hafnium carbide single crystal (specifically, a nanowire emitter made of hafnium carbide single crystal before being coated with hafnium oxide in Patent Literature 1). Therefore, electrons are more efficiently emitted.

Preferably, the end 120 through which electrons are to be emitted is terminated with Hf (hafnium) of the HfC single crystal. This reduces the work function, so that electrons can be more efficiently emitted. The termination with Hf can be simply confirmed by calculating the work function.

More preferably, in case where the end 120 through which electrons are to be emitted is terminated with Hf, the Hf may be combined with oxygen and/or nitrogen. This reduces dangling bond and stabilizes the Hf so that electrons can be emitted with high efficiency. More preferably, the combination of Hf with oxygen and/or nitrogen allows the end 120 through which electrons are to be emitted to be coated with hafnium oxide, nitride or oxynitride. When the end 120 has oxide, nitride or oxynitride, the material itself is stabilized, so that electrons can be emitted with high efficiency. In this case, the thickness of hafnium oxide, nitride or oxynitride is preferably in a range of 1 nm or more and 5 nm or less. When the thickness is less than 1 nm, Hf might not be sufficiently stabilized. When the thickness exceeds 5 nm, emission of electrons through the HfC single crystal 110 might be suppressed. The formation of hafnium oxide, nitride or oxynitride is estimated from experimental condition or by field emission measurement.

In FIG. 1, the nanowire 100 is shown as the emitter itself, but is not limited thereto. For example, the emitter may be the nanowire 100 itself, the nanowire 100 may be attached to and integrated with a needle, or may be further attached to a filament.

Next, a description is made of a method for manufacturing the emitter according to Embodiment 1.

Figure 2:
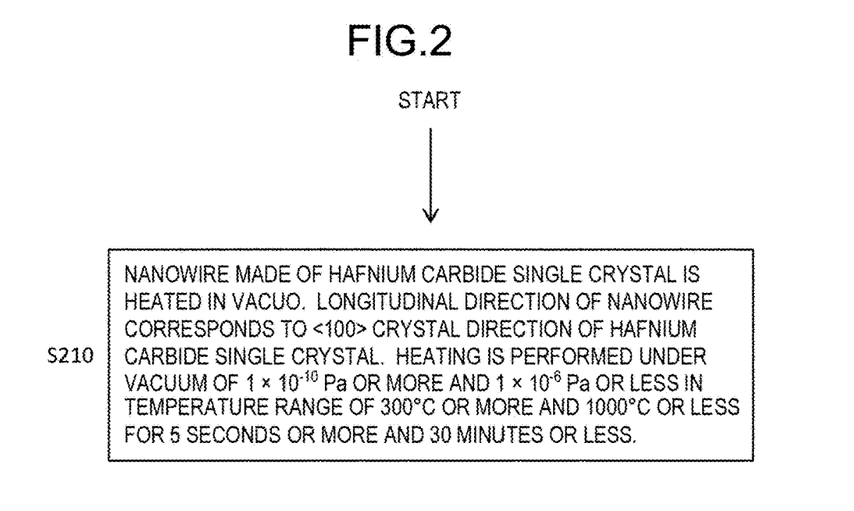
FIG. 2 is a flowchart showing a method for manufacturing the emitter according to Embodiment 1.

FIG. 2 is a flowchart showing a method for manufacturing the emitter according to Embodiment 1.

Figure 3:
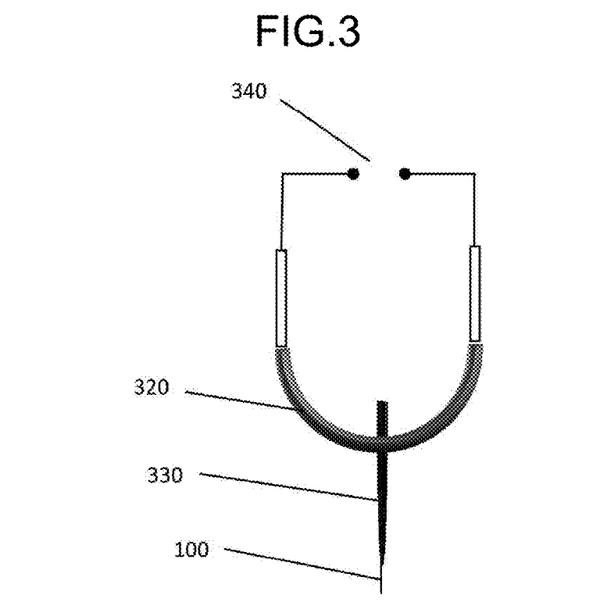
FIG. 3 is a schematic view showing a state in which a method for manufacturing the emitter according to Embodiment 1 is performed.

FIG. 3 is a schematic view showing a state in which a method for manufacturing the emitter according to Embodiment 1 is performed.

Step 210: The nanowire 100 made of the hafnium carbide (Hf) single crystal 110 is heated in vacuo. The longitudinal direction of the nanowire 100 corresponds to the <100> crystal direction of the HfC single crystal 110. Here, the end of the nanowire 100 is heated in a heating condition under a vacuum of $1 \times 10^{-10}$ Pa or more and $1 \times 10^{-6}$ Pa or less in a temperature range of 300° C. or more and 1000° C. or less for 5 seconds or more and 30 minutes or less. When being heated in the above-mentioned condition, in addition to cleaning a nanowire by ordinary heat flashing, the surface can be modified so that the end of the nanowire has the (200) plane and the {311} plane(s), the (200) plane is centered, and the {311} plane(s) surrounds the (200) plane. Here, the "ordinary heat flashing" performed for cleaning a nanowire is an optional treatment, as mentioned above, and even without this treatment, the surface modification can be performed so that the above end has the above-mentioned plane orientation.

When the degree of vacuum exceeds $1 \times 10^{-6}$ Pa, the surface modification of the end of the HfC single crystal 110 may not sufficiently proceed. The lower limit of the degree of vacuum is not particularly limited, but the degree of vacuum is appropriately $1 \times 10^{-10}$ Pa in view of the limit of apparatus. When the heating temperature is lower than 300° C., the surface modification of the end of the nanowire 100 may not sufficiently proceed. On the other hand, when the heating temperature exceeds 1000° C., it becomes difficult to control the surface processing at an atomic level. When the heating time is less than 5 seconds, the surface modification may not sufficiently proceed. On the other hand, when the heating time exceeds 30 minutes, there is no change in the degree of surface modification, and thus such a condition is inefficient.

In a step S210, heating is preferably performed in a temperature range of more than 600° C. and 1000° C. or less for 1 minute or more and 5 minutes or less. As a result, the end 120 of the nanowire 100 through which electrons are to be emitted has a tapered shape, and the HfC single crystal 110 is terminated with Hf More preferably, heating is performed in a temperature range of 650° C. or more and 750° C. or less for 1 minute or more and 5 minutes or less. As a result, the HfC single crystal 110 can be reliably terminated with Hf. The present inventors have experimentally confirmed the following: when the heating temperature is lower than 650° C., the end 120 may not be terminated with Hf, so that the work function may not be sufficiently reduced. Accordingly, from the viewpoint of more stably terminating the end 120 with Hf, the temperature is more preferably 650° C. or more.

Preferably, following the step S210, a step of introducing oxygen and/or nitrogen may be performed. As a result, when the end 120 through which electrons are to be emitted is terminated with Hf, the end 120 can be made of Hf oxide, nitride or oxynitride. More preferably, oxygen and/or nitrogen are introduced until the degree of vacuum is greater than $1\times10^{-6}$ Pa and $1\times10^{-4}$ Pa or less. As a result, hafnium oxide, nitride or oxynitride having a thickness in a range of 1 nm or more and 5 nm or less can be obtained. More preferably, it is desirable to introduce oxygen and/or nitrogen until the degree of vacuum becomes $1\times10^{-5}$ Pa or more and $1\times10^{-4}$ Pa or less.

In the step of introducing oxygen and/or nitrogen, the end of the nanowire may be preferably heated in a temperature range of 650° C. or more and 850° C. or less for 3 minutes or more and 10 minutes or less. This promotes the growth of hafnium oxide, nitride or oxynitride.

For example, the method according to the present invention can be performed using a device shown in FIG. 3. As shown in FIG. 3, the nanowire 100 may be attached to a filament 320, and the filament 320 is energized and heated. Specifically, the nanowire 100 is attached to the filament 320 via a needle 330 made of an element selected from the group consisting of tungsten (W), tantalum (Ta), platinum (Pt), rhenium (Re) and carbon (C). The nanowire 100 may be attached to a needle 330 through a conductive adhesive sheet such as a carbon pad. By energizing the filament 320 via a power supply 340, the filament is heated and the surface of the nanowire 100 can be modified. It should be noted that the device shown in FIG. 3 can be mounted on a vacuum chamber or the like to maintain a desired degree of vacuum. The heating temperature caused by the filament 320 can be measured by, for example, radiation thermometer or thermal imaging camera.

Embodiment 2

Embodiment 2 describes an electron gun equipped with the emitter according to the present invention.

Figure 4:
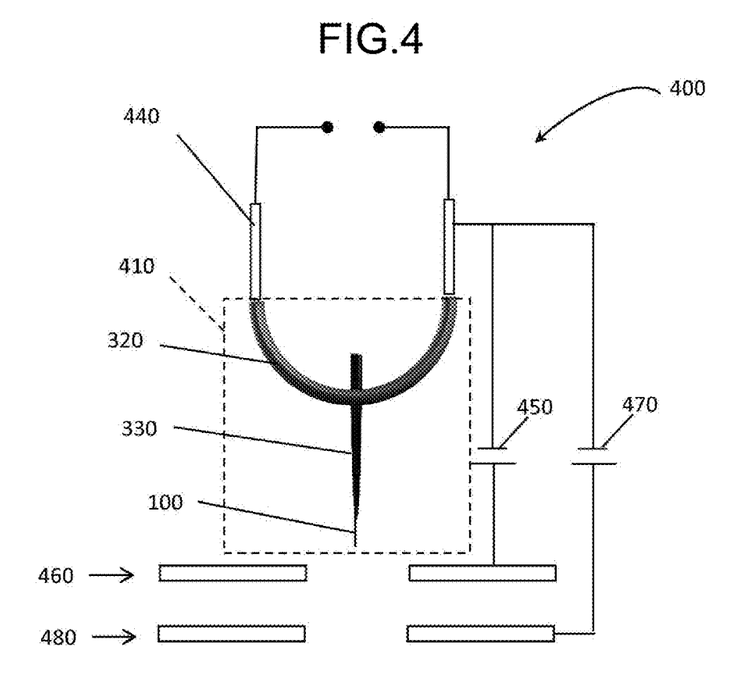
FIG. 4 is a schematic view showing an electron gun according to Embodiment 2.

FIG. 4 is a schematic view showing the electron gun according to Embodiment 2.

The electron gun 400 according to the present invention includes at least the emitter 410 having the nanowire 100 described in Embodiment 1. In FIG. 4, the emitter 410 further includes, in addition to the nanowire 100, the filament 320 and the needle 330.

The nanowire 100 is attached to the filament 320 via the needle 330 made of an element selected from the group consisting of tungsten (W), tantalum (Ta), platinum (Pt), rhenium (Re) and carbon (C). This is preferable because the handling of the nanowire 100 is simplified. In FIG. 4, the filament 320 has a hairpin-type shape (U-shape), but is not limited thereto. The filament 320 may have any shape such as a V-shape.

In the electron gun 400, an extraction power supply 450 is connected between an electrode 440 and an extraction electrode 460, in which the extraction power supply 450 applies a voltage between the emitter 410 and the extraction electrode 460. Furthermore, in the electron gun 400, an acceleration power supply 470 is connected between the electrode 440 and an acceleration electrode 480, in which the acceleration power supply 470 applies a voltage between the emitter 410 and the acceleration electrode 480.

Furthermore, the electrode 440 may be further connected to a flash power supply when the electron gun 400 is a cold cathode field emission electron gun, or may be connected to a heating power supply when the electron gun 400 is a Schottky electron gun.

The electron gun 400 may be placed under a vacuum of $10^{-8}$ Pa to $10^{-7}$ Pa ($10^{-8}$ Pa or more and $10^{-7}$ Pa or less). In this case, the end of the emitter 410 through which electrons are to be emitted can be kept clean.

The operations when the electron gun 400 according to the present invention is a cold cathode field emission electron gun are briefly described below.

The extraction power supply 450 applies a voltage between the emitter 410 and the extraction electrode 460. As a result, an electric field concentration is generated at the end of the nanowire 100 of the emitter 410 through which electrons are to be emitted, and thus electrons are extracted. Furthermore, the acceleration power supply 470 applies a voltage between the emitter 410 and the acceleration electrode 480. As a result, electrons extracted at the end of the nanowire 100 of the emitter 410 through which electrons are to be emitted are accelerated and emitted toward a sample. The surface of the nanowire 100 may be cleaned by, if needed, performing flashing using a flash power supply connected to the electrode 440. These operations are performed under the above-mentioned vacuum.

The operations when the electron gun 400 according to the present invention is a Schottky electron gun are briefly described below.

A heating power supply connected to the electrode 440 heats the emitter 410, and the extraction power supply 450 applies a voltage between the emitter 410 and the extraction electrode 460. As a result, a Schottky emission is generated at the end of the nanowire 100 of the emitter 410 through which electrons are to be emitted, and thus electrons are extracted. Furthermore, the acceleration power supply 470 applies a voltage between the emitter 410 and the acceleration electrode 480. As a result, electrons extracted at the end of the nanowire 100 of the emitter 410 through which electrons are to be emitted are accelerated and emitted toward a sample. These operations are performed under the above-mentioned vacuum. Since thermoelectrons can be emitted from the nanowire 100 of the emitter 410 by the heating power supply, the electron gun 400 may further include a suppressor (not shown in the drawings) for shielding thermoelectrons.

Since the electron gun 400 according to the present invention includes the emitter 410 equipped with the nanowire 100 described in detail in Embodiment 1, electrons can be easily and stably emitted for a long time. Such an electron gun 400 is employed in any electronic device having an electron focusing ability. For example, such an electronic device is selected from the group consisting of scanning electron microscope, transmission electron microscope, scanning transmission electron microscope, Auger electron spectrometer, electron energy loss spectrometer and energy dispersive electron spectrometer.

Next, the present invention is described in detail with reference to specific examples, but it should be noted that the present invention is not limited to these examples.

EXAMPLES

Example 1

In Example 1, an emitter was manufactured by modifying the surface of a nanowire made of HfC single crystal in a heating temperature range of 650° C. to 750° C. (650° C. or more and 750° C. or less).

Prior to surface modification, nanowires composed of HfC single crystal were manufactured by CVD method. Nanowires made of HfC single crystal were prepared on a graphite substrate in the same procedure and condition as in Reference Example 1 of Patent Literature 1. One of the nanowires was taken out and observed by scanning electron microscope (SEM, JSM-6500F, manufactured by JEOL) and transmission electron microscope (TEM, JEOL-2100F, manufactured by JEOL) equipped with an energy dispersive X-ray analyzer (EDS). The results are shown in FIG. 5.

Figure 5:
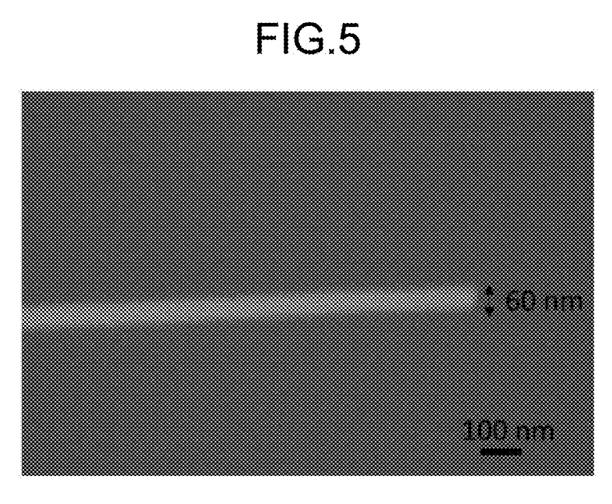
FIG. 5 is a view showing a low magnification TEM image of a nanowire before undergoing surface modification.

FIG. 5 is a view showing a low magnification TEM image of a nanowire before undergoing surface modification.

As a result of EDS measurement, only Hf and C were detected, having an atomic ratio is 1:1. From this, it has been confirmed that the synthesized nanowire is hafnium carbide (HfC). According to FIG. 5, it has been found that the nanowire is made of one type of crystal and has a length in the lateral direction of 60 nm and a length in the longitudinal direction of 3 μm. In addition, from the observation results by means of a high-resolution transmission electron microscope image (HRTEM image), it has been confirmed that the longitudinal direction of the nanowire corresponds to the <100> crystal direction of the HfC single crystal. Furthermore, although not being shown in the drawings, according to the selected area electron diffraction pattern (SAED), the nanowire was of single crystal.

Next, the nanowire was surface-modified to manufacture an emitter, using the device shown in FIG. 3. The procedure for manufacturing the emitter was as follows. A wire made of tantalum was etched and processed into a Ta needle (330 in FIG. 3) having one end tapered. Next, the Ta needle was connected to a hairpin shaped tungsten filament (320 in FIG. 3) by welding. The nanowire (100 in FIG. 3) was fixed to the tapered Ta needle using a carbon pad. The degree of vacuum in a vacuum chamber was $1 \times 10^{-7}$ Pa.

Next, the nanowire was heated in vacuo (the step S210 in FIG. 2). In detail, a current of 2.3 A was applied to the tungsten filament via a power supply (340 in FIG. 3), and its state was maintained for 3 minutes. When the temperature of the tungsten filament was measured by radiation thermometer, the temperature was 650° C. to 750° C. (650° C. or more and 750° C. or less).

Figure 6:
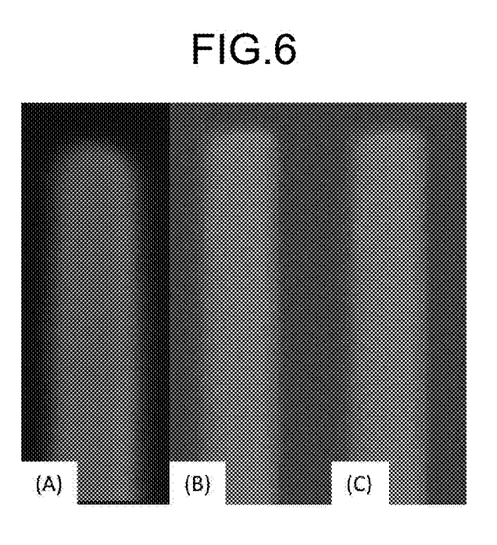
FIG. 6 is an SEM image showing each end of nanowires according to Examples 1 and 2/Comparative Example 3.
Figure 7:
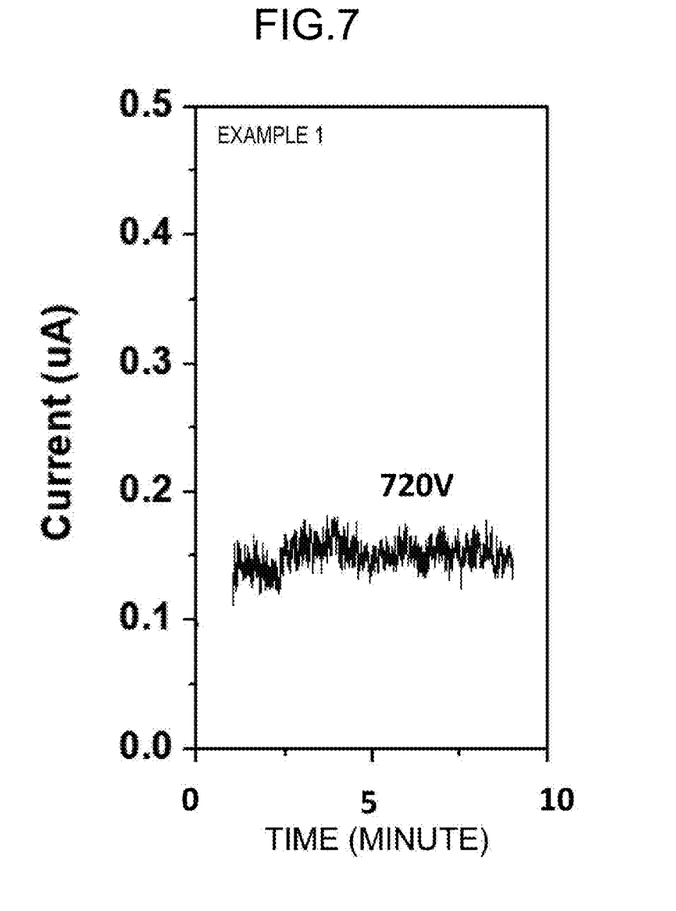
FIG. 7 is a diagram showing the time dependence of a field emission current of the emitter using a nanowire according to Example 1.
Figure 10:
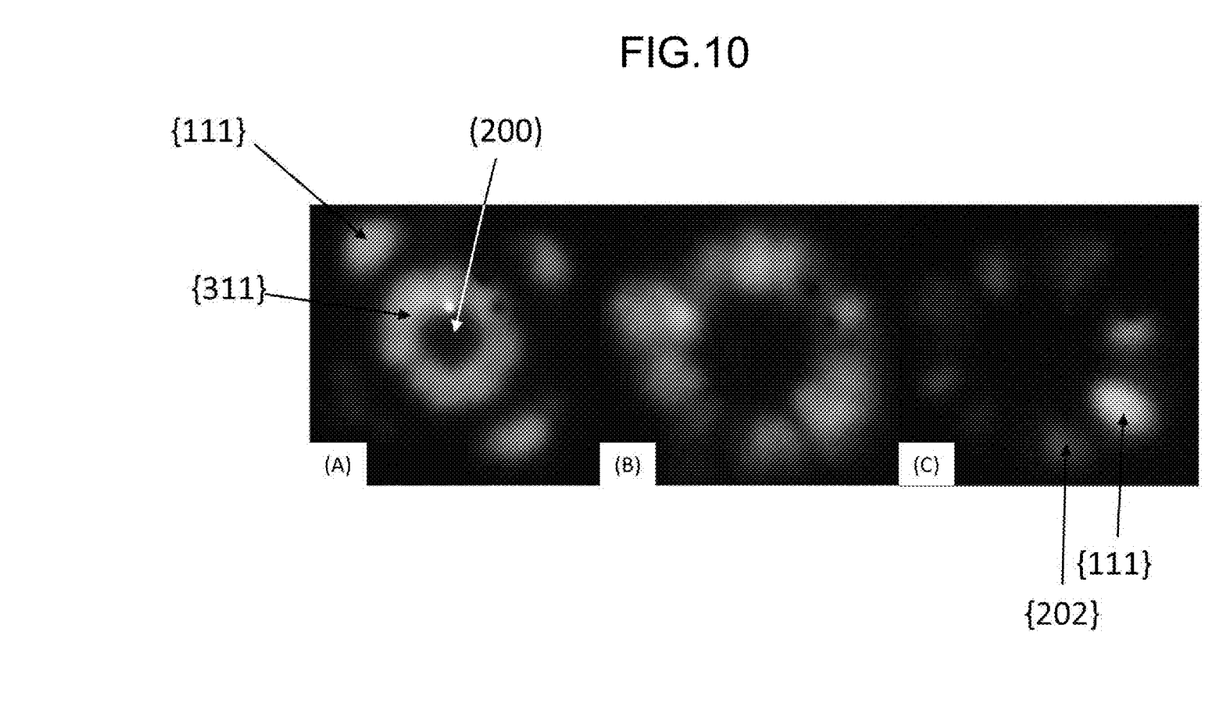
FIG. 10 is a view showing each field emission pattern of nanowires according to Examples 1 and 2/Comparative Example 3.

The nanowire thus obtained was observed by SEM. The results are shown in FIG. 6. Next, the time dependence of the field emission current of the emitter at room temperature and an extraction voltage of 720 V was measured using a field ion microscope (FIM). The results are shown in FIG. 7. Next, the field emission pattern was observed by inverting the polarity of the extraction voltage of the emitter to generate field emission. The results are shown in FIG. 10.

Figure 11:
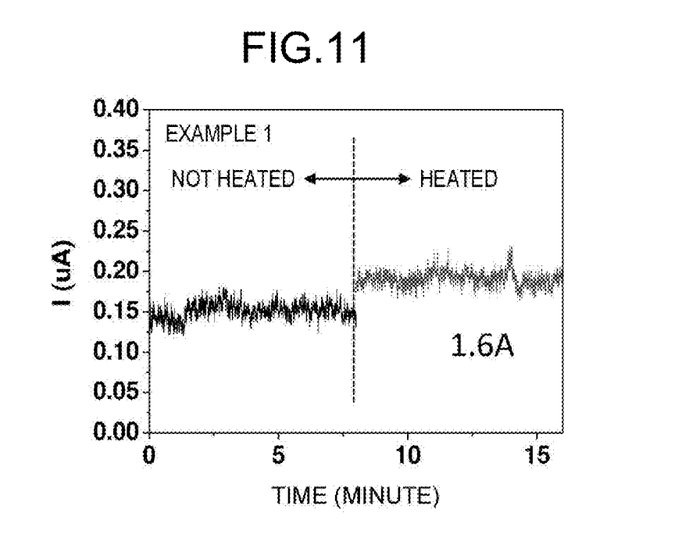
FIG. 11 is a diagram showing the time dependence of the field emission current of the emitter using a nanowire according to Example 1 before or after undergoing heating.

Furthermore, the above-mentioned time dependence of the field emission current was measured while performing heating. At this time, the heating was at 1.6 A (in a range of 300° C. or more and 500° C. or less). The results are shown in FIG. 11.

Example 2

In Example 2, an emitter was manufactured by surface-modifying a nanowire made of HfC single crystal that was manufactured by CVD method in the same manner as in Example 1 in a heating temperature range of 500° C. to 600° C. (500° C. or more and 600° C. or less). The condition for heating the nanowire was the same as that in Example 1, except that a current of 2.1 A (500° C. to 600° C. (500° C. or more and 600° C. or less) according to a radiation thermometer) was applied and its state was maintained for 1 minute.

Figure 8:
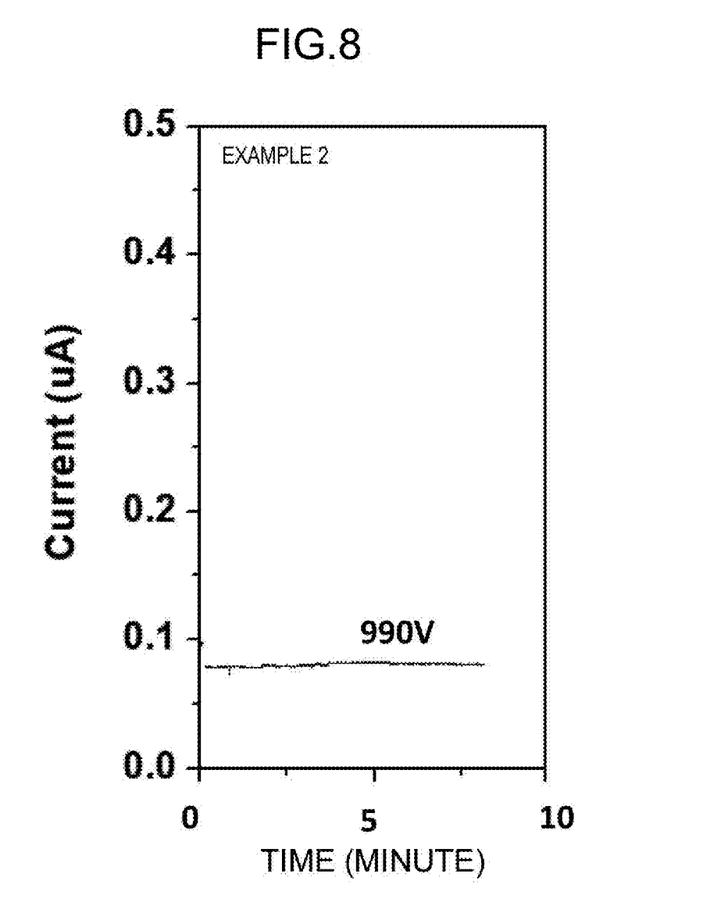
FIG. 8 is a diagram showing the time dependence of the field emission current of the emitter using a nanowire according to Example 2.

The nanowire thus obtained was observed by SEM. The results are shown in FIG. 6. In the same manner as in Example 1, the time dependence of the field emission current of the emitter at room temperature and an extraction voltage of 990 V was measured using an FIM. The results are shown in FIG. 8. The field emission pattern was observed in the same manner as in Example 1. The results are shown in FIG. 10.

Figure 12:
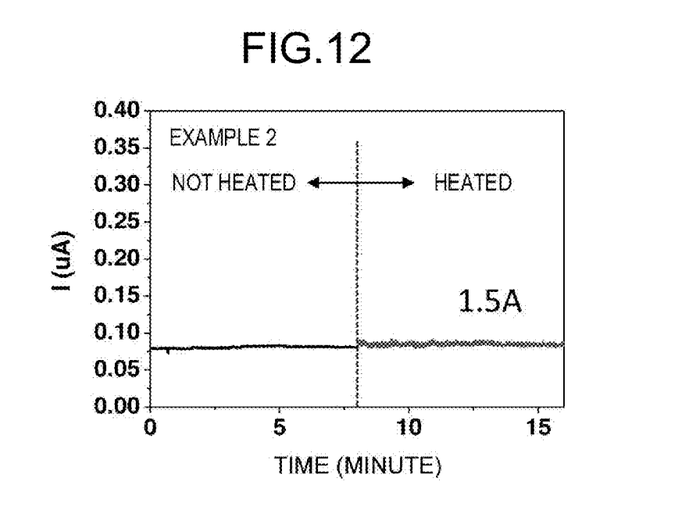
FIG. 12 is a diagram showing the time dependence of the field emission current of the emitter using a nanowire according to Example 2 before or after undergoing heating.

In addition, in the same manner as in Example 1, the above-mentioned time dependence of the field emission current was measured while performing heating. At this time, the heating was at 1.5 A (in a range of 300° C. or more and 500° C. or less). The results are shown in FIG. 12.

Comparative Example 31

Figure 9:
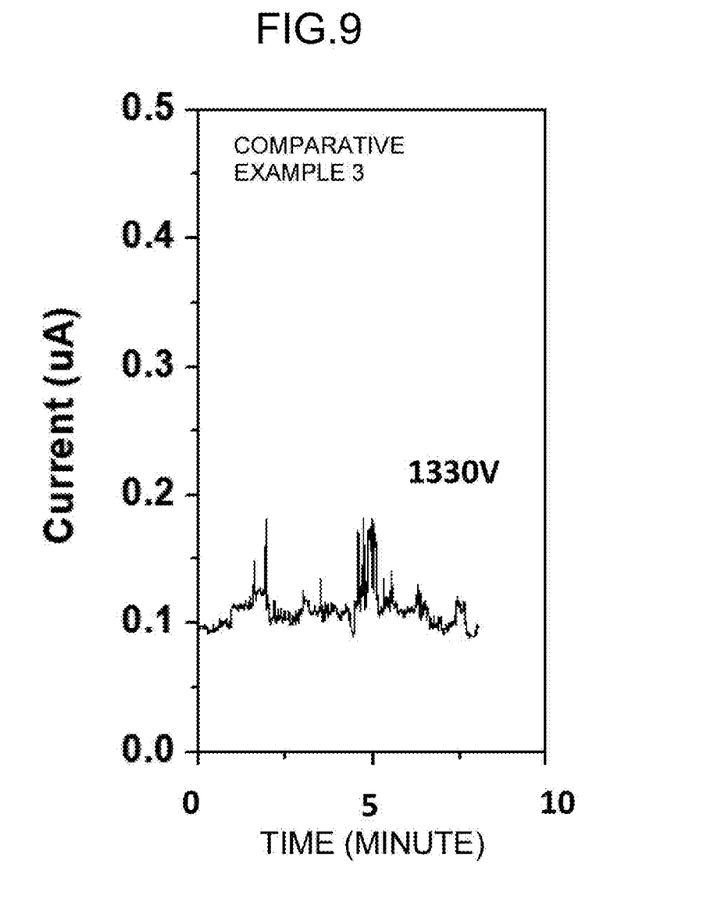
FIG. 9 is a diagram showing the time dependence of the field emission current of the emitter using a nanowire according to Comparative Example 3.

In Comparative Example 3, a nanowire made of HfC single crystal manufactured by CVD method in the same manner as in Example 1 was used for an emitter without surface modification by heating. In the same manner as in Example 1, the time dependence of the field emission current of the emitter at room temperature and an extraction voltage of 1330 V was measured using an FIM. The results are shown in FIG. 9. The field emission pattern was observed in the same manner as in Example 1. The results are shown in FIG. 10.

The above experimental conditions are summarized in Table 1 for simplicity.

TABLE 1

List of experimental condition for emitter according to Examples 1 and 2/Comparative Example 3

| Example/ Comparative Example | Size of HfC | Heat-treatment condition | | | |
|---|---|---|---|---|---|
| | | Degree of vacuum (Pa) | Temperature (° C.) | Current value (A) | Time minute |
| Example 1 | 3 μm in length, 60 nmφ | $1 \times 10^{-7}$ | 650~750 | 2.3 | 3 |
| Example 2 | 3 μm in length, 60 nmφ | $1 \times 10^{-7}$ | 500~600 | 2.1 | 1 |
| Comparative Example 3 | 3 μm in length, 60 nmφ | — | — | — | — |

FIG. 6 is an SEM image showing the ends of the nanowires according to Examples 1 and 2/Comparative Example 3. The sizes areas described in "Size of HfC" in Table 1.

FIGS. 6(A) to 6(C) are SEM images showing the ends of the nanowires according to Example 1, Example 2, and Comparative Example 3, respectively. The nanowire according to Comparative Example 3 shown in FIG. 6(C) is the same as that in FIG. 5 because it has not been heat-treated.

According to FIG. 6(A), it has been found that the end of the nanowire according to Example 1 has a tapered shape and the surface has been modified. Although the end of the nanowire according to Example 2 shown in FIG. 6(B) is not as tapered as the end of the nanowire according to Example 1 shown in FIG. 6(A), it indicates to have a slightly tapered shape, so that its surface has been modified. This indicates that heating the nanowire in vacuo is advantageous for surface modification.

FIG. 7 is a diagram showing the time dependence of the field emission current of the emitter using a nanowire according to Example 1.

FIG. 8 is a diagram showing the time dependence of the field emission current of the emitter using a nanowire according to Example 2.

FIG. 9 is a diagram showing the time dependence of the field emission current of the emitter using a nanowire according to Comparative Example 3.

As shown in FIG. 9, the field emission current property of the nanowire according to Comparative Example 3 was not stable. On the other hand, according to FIG. 7, the nanowire according to Example 1 exhibited relatively stable field emission current property over about 10 minutes, and the current value was as high as about 0.15 µA. According to FIG. 8, the nanowire according to Example 2 exhibited more stable field emission current property than that of the nanowire according to Example 1, but the current value was smaller.

These results indicate that the nanowires of which surfaces have been modified by heating in vacuo have improved field emission properties. Furthermore, since the current value in the nanowire according to Example 1 is larger than that according to Example 2, it has been found that the end of the nanowire according to Example 1 has reduced work function and promoted release of electrons due to termination with Hf.

FIG. 10 is a view showing the field emission patterns of nanowires according to Examples 1 and 2/Comparative Example 3.

FIGS. 10(A) to 10(C) show the field emission patterns of the nanowire according to Example 1, the nanowire according to Example 2, and the nanowire according to Comparative Example 3, respectively. In FIG. 10, areas shown bright in the gray scale are the field emission area.

According to FIG. 10, it has been found that the field emission areas in the nanowires according to Examples 1 and 2 are wider and more concentrated at the center than the field emission areas in the nanowire according to Comparative Example 3. These results also indicate that the nanowires of which surfaces have been modified by heating in vacuo have improved field emission properties. Furthermore, comparing FIG. 10(A) with FIG. 10(B), it has been found that the field emission area in the nanowire according to Example 1 is more concentrated at the center than that according to Example 2. Furthermore, when the plane index of the HfC single crystal in the field emission pattern was specified, it has been indicated that the {311} plane(s) surrounds the (200) plane with the (200) plane centered, as shown in FIG. 10(A).

From these, it has been found that only when a nanowire made of HfC single crystal of which longitudinal direction matches the <100> crystal direction is heated in a temperature range of 650° C. or more and 750° C. or less for 1 minute or more and 5 minutes or less in vacuo, the end emitting electrons can be surface-modified so that the {311} plane(s) surrounds the (200) plane with the (200) centered, and thus electrons can be efficiently and stably released.

In addition, comparing the field emission patterns of the nanowire emitters according to Examples 1 and 2 in FIG. 10 (i.e., FIGS. 10(A) and 10(B)) to the field emission pattern of a conventional emitter made of hafnium carbide single crystal (specifically, a nanowire emitter made of hafnium carbide single crystal before being coated with hafnium oxide in Patent Literature 1) (see FIGS. 12(A) and 12(B) in Patent Literature 1), the field emission patterns showing that the area shown brightly in the gray scale (i.e., the field emission area) is more concentrated at the center (tip) of the emitter end are apparently seen in FIG. 10 (i.e., the nanowire emitter according to the present invention). Therefore, it has been also confirmed that, according to the emitter of the present invention (specifically, the emitter equipped with a nanowire made of hafnium carbide (HfC) single crystal, in which the longitudinal direction of the nanowire corresponds to the <100> crystal direction of the hafnium carbide single crystal, and the end of the nanowire through which electrons are to be emitted has the (200) plane and the {311} plane(s), and the {311} plane(s) surrounds the (200) plane with the (200) centered), electrons can be emitted more efficiently and more stably, compared to conventional nanowire emitters made of hafnium carbide single crystal.

FIG. 11 is a diagram showing the time dependence of the field emission current of the emitter using a nanowire according to Example 1 before or after undergoing heating.

FIG. 12 is a diagram showing the time dependence of the field emission current of the emitter using a nanowire according to Example 2 before or after undergoing heating.

According to FIG. 11 and FIG. 12, in both cases, the field emission current properties are further stabilized by heating, and in the nanowire according to Example 1, the current value is further improved. From this, it has been found that the properties of the nanowire according to the present invention are further improved by auxiliary heating current, and it is particularly advantageous for a Schottky electron gun among electron guns.

Example 41

In Example 4, in the same manner as in Example 1, a nanowire made of surface-modified HfC single crystal was further treated with oxygen to manufacture an emitter. The conditions of the oxygen treatment are as follows: after performing the surface modification under the same condition as in Example 1, oxygen was introduced, the degree of vacuum after the oxygen introduction was maintained at $5 \times 10^{-5}$ Pa, a current of 2.5 A (800° C. according to a radiation thermometer) was applied, and its state was maintained for 5 minutes.

From the condition of oxygen introduction, an oxide of Hf (HfOx: $0 < x \leq 2$) was formed at the end of the HfC single crystal, and the thickness of the oxide was estimated to be 3 nm.

In the same manner as in Example 1, the nanowire thus obtained was observed by SEM. The time dependence of the field emission current of the emitter at room temperature and an extraction voltage of 720 V was measured using an FIM, and the field emission pattern was observed. Although not shown, it has been observed that, in addition to the same stability as that of Example 1, the field emission current properties of the nanowire according to Example 4 have improved current value. From this, it has been found that bonding the terminal Hf with oxygen, nitrogen or the like allows the nanowire according to the present invention to more efficiently and stably emit electrons because the end through which electrons are to be emitted is stabilized with the oxide, nitride or the like of Hf.

INDUSTRIAL APPLICABILITY

Because using the emitter according to the present invention allows electrons to be efficiently and stably emitted, it can be applied for any device having an electron focusing ability such as scanning electron microscope, transmission electron microscope, scanning transmission electron microscope, Auger electron spectrometer, electron energy loss spectrometer, and energy dispersive electron spectrometer.

REFERENCE SIGNS LIST

100 Nanowire
110 Hafnium carbide (Hf) single crystal
120 End through which electrons are to be emitted
320 Filament
330 Needle
340 Power supply
400 Electron gun
410 Emitter
440 Electrode
450 Extraction power supply
460 Extraction electrode
470 Acceleration power supply
480 Acceleration electrode

The invention claimed is:

1. An emitter comprising a nanowire, wherein
the nanowire is made of hafnium carbide (HfC) single crystal,
a longitudinal direction of the nanowire corresponds to a <100> crystal direction of the hafnium carbide single crystal,
an end of the nanowire through which electrons are to be emitted has a (200) plane and a plurality of {311} planes of the hafnium carbide single crystal, the (200) plane is centered, and the plurality of {311} planes surrounds the (200) plane.

2. The emitter according to claim 1, wherein a length in a lateral direction of the nanowire is 1 nm or more and 100 nm or less, and a length in a longitudinal direction of the nanowire is 500 nm or more and 30 μm or less.

3. The emitter according to claim 1, wherein the end through which the electrons are to be emitted has a tapered shape.

4. The emitter according to claim 1, wherein the end through which the electrons are to be emitted are terminated with hafnium (Hf) of the hafnium carbide single crystal.

5. The emitter according to claim 4, wherein the hafnium is combined with oxygen, nitrogen, or oxygen and nitrogen.

6. The emitter according to claim 5, wherein the end through which the electrons are to be emitted is coated with an oxide, nitride or oxynitride of the hafnium.

7. The emitter according to claim 6, wherein a thickness of the oxide, nitride or oxynitride of the hafnium is 1 nm or more and 5 nm or less.

8. An electron gun comprising at least an emitter, wherein the emitter is the emitter according to claim 1.

9. The electron gun according to claim 8, wherein
the emitter further comprises a needle and a filament, and
the nanowire is attached to the filament via the needle made of an element selected from the group consisting of tungsten (W), tantalum (Ta), platinum (Pt), rhenium (Re) and carbon (C).

10. The electron gun according to claim 8, wherein the electron gun is a cold cathode field emission electron gun or a Schottky electron gun.

11. An electronic device comprising an electron gun, wherein
the electron gun is the electron gun according to claim 8,
the electronic device is selected from the group consisting of scanning electron microscope, transmission electron microscope, scanning transmission electron microscope, Auger electron spectrometer, electron energy loss spectrometer, and energy dispersive electron spectrometer.

12. A method for manufacturing the emitter according to claim 1, comprising:
a heating step of heating a nanowire made of hafnium carbide single crystal in vacuo, wherein a longitudinal direction of the nanowire corresponds to a <100> crystal direction of the hafnium carbide single crystal, and the end of the nanowire is heated under a vacuum of $1\times10^{-10}$ Pa or more and $1\times10^{-6}$ Pa or less in a temperature range of 300° C. or more and 1000° C. or less for 5 seconds or more and 30 minutes or less.

13. The method according to claim 12, wherein in the heating step, the end of the nanowire is heated in a temperature range of more than 600° C. and 1000° C. or less for 1 minute or more and 5 minutes or less.

14. The method according to claim 13, wherein in the heating step, the end of the nanowire is heated in a temperature range of 650° C. or more and 750° C. or less for 1 minute or more and 5 minutes or less.

15. The method according to claim 12, wherein in the heating step, the nanowire is attached to a filament, and the filament is energized and heated.

16. The method according to claim 12, further comprising, subsequent to the heating step, the step of introducing oxygen and/or nitrogen.

17. The method according to claim 16, wherein in the step of introducing the oxygen and/or nitrogen, oxygen and/or nitrogen is introduced until a pressure becomes greater than $1\times10^{-6}$ Pa and $1\times10^{-4}$ Pa or less.

18. The method according to claim 16, wherein in the step of introducing the oxygen and/or nitrogen, the end of the nanowire is heated in a temperature range of 650° C. or more and 850° C. or less for 3 minutes or more and 10 minutes or less.

* * * * *